US012804969B2

(12) United States Patent
Wu et al.

(10) Patent No.: US 12,804,969 B2
(45) Date of Patent: Nov. 17, 2026

(54) STACKED TWO-TRANSISTOR DYNAMIC RANDOM ACCESS MEMORY CELL

(71) Applicant: International Business Machines Corporation, Armonk, NY (US)

(72) Inventors: Heng Wu, Santa Clara, CA (US); Julien Frougier, Albany, NY (US); Ruilong Xie, Niskayuna, NY (US); Min Gyu Sung, Latham, NY (US); Chen Zhang, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 18/328,871

(22) Filed: Jun. 5, 2023

(65) Prior Publication Data

US 2024/0405071 A1 Dec. 5, 2024

(51) Int. Cl.

| | |
|---|---|
| ***H10D 62/10*** | (2025.01) |
| ***H10B 12/00*** | (2023.01) |
| ***H10D 30/01*** | (2025.01) |
| ***H10D 30/43*** | (2025.01) |
| ***H10D 30/67*** | (2025.01) |
| ***H10D 84/83*** | (2025.01) |

(52) U.S. Cl.

CPC ......... *H10D 62/121* (2025.01); *H10B 12/482* (2023.02); *H10B 12/488* (2023.02); *H10D 30/014* (2025.01); *H10D 30/43* (2025.01); *H10D 30/6735* (2025.01); *H10D 30/6757* (2025.01); *H10D 84/83* (2025.01)

(58) Field of Classification Search

CPC .... H10D 62/121; H10D 30/014; H10D 30/43; H10D 30/6735; H10D 30/6757; H10D 84/83; H10D 30/6755; H10D 88/00; H10B 12/482; H10B 12/488; H10B 12/05

See application file for complete search history.

(56) References Cited

U.S. PATENT DOCUMENTS

| | | | | |
|---|---|---|---|---|
| 9,741,721 | B2 | 8/2017 | Park et al. | |
| 9,991,267 | B1 | 6/2018 | Anderson et al. | |
| 10,636,792 | B2 * | 4/2020 | Jagannathan ...... | H10D 30/6735 |
| 10,818,674 | B2 | 10/2020 | Mann et al. | |
| 10,833,191 | B2 | 11/2020 | Frougier et al. | |
| 10,937,789 | B2 | 3/2021 | Reznicek et al. | |
| 11,315,938 | B1 | 4/2022 | Reznicek et al. | |
| 11,450,669 | B2 | 9/2022 | Sharma et al. | |
| 2020/0119015 | A1 * | 4/2020 | Bi .......................... | B82Y 10/00 |
| 2021/0125986 | A1 * | 4/2021 | Vellianitis .......... | H10D 30/6735 |
| 2021/0151437 | A1 * | 5/2021 | Tomishima ............ | H10B 12/00 |

(Continued)

OTHER PUBLICATIONS

G.-W. Chang et al., "Abnormal Subthreshold Leakage Current at High Temperature in InGaZnO Thin-Film Transistors," IEEE Electron Device Letters, Apr. 2012, pp. 540-542, vol. 33, No. 4.

(Continued)

*Primary Examiner* — Mark W Tornow

(74) *Attorney, Agent, or Firm* — Kimberly Zillig; Ryan, Mason & Lewis, LLP

(57) ABSTRACT

A semiconductor structure includes a nanosheet field-effect transistor having a nanosheet stack structure, and a fin field-effect transistor having a set of vertical fins. Each of the vertical fins includes an oxide semiconductor material. The nanosheet field-effect transistor and the fin field-effect transistor are in a stacked configuration.

18 Claims, 7 Drawing Sheets

(56) References Cited

U.S. PATENT DOCUMENTS

2022/0352179 A1 11/2022 Yang et al.
2024/0006480 A1* 1/2024 Bao ...................... H10D 30/014

OTHER PUBLICATIONS

J. Liu, "Imec Demonstrates Capacitor-less IGZO-Based DRAM Cell With >400s Retention Time," https://www.imec-int.com/en/press/imec-demonstrates-capacitor-less-igzo-based-dram-cell-400s-retention-time, Dec. 15, 2020, 2 pages.

* cited by examiner

STACKED TWO-TRANSISTOR DYNAMIC RANDOM ACCESS MEMORY CELL

BACKGROUND

A memory circuit is a collection of storage cells, referred to hereinafter as "bit cells", together with associated circuits needed to transfer information to or from any desired location within the memory circuit. A common type of such a memory circuit is Random Access Memory (RAM). Integrated circuit RAM units are available as one of two general types: static and dynamic. Static RAM consists essentially of internal latches that store binary information. Any information stored in this manner will remain intact as long as power is applied to the unit. The dynamic RAM, or DRAM, stores the binary information in the form of electric charges that are stored in capacitors. The capacitors are typically provided inside the integrated circuit by metal-oxide-semiconductor (MOS) transistors. Because capacitors lose charge over time, DRAM circuits must include logic to refresh (recharge) the RAM devices continuously. While a conventional DRAM is being refreshed, it cannot be read by the processor, thus causing DRAM to be slower than static random access memory devices (SRAMs). Despite being slower, DRAMs are more commonly utilized than SRAMs because their circuitry is simpler and because they can hold several times as much data per unit area on an integrated circuit.

SUMMARY

Illustrative embodiments of the present application include techniques for use in semiconductor manufacture. In an illustrative embodiment, a semiconductor structure comprises a nanosheet field-effect transistor comprising a nanosheet stack structure, and a fin field-effect transistor comprising a set of vertical fins. Each of the vertical fins comprises an oxide semiconductor material. The nanosheet field-effect transistor and the fin field-effect transistor are in a stacked configuration.

According to another exemplary embodiment, an integrated circuit comprises one or more semiconductor structures. At least one of the semiconductor structures comprises a nanosheet field-effect transistor comprising a nanosheet stack structure, and a fin field-effect transistor comprising a set of vertical fins. Each of the vertical fins comprises an oxide semiconductor material. The nanosheet field-effect transistor and the fin field-effect transistor are in a stacked configuration.

According to yet another exemplary embodiment, a semiconductor structure comprises a nanosheet field-effect transistor comprising a nanosheet stack structure and a first gate structure, and a fin field-effect transistor. The fin field-effect transistor comprises a set of vertical fins, a second gate structure disposed on at least one vertical fin, a write word line disposed on the second gate structure, a write bit line disposed on the at least one vertical fin; and a metal contact connected to the first gate structure. Each of the vertical fins comprises an oxide semiconductor material. The nanosheet field-effect transistor and the fin field-effect transistor are in a stacked configuration.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1A:
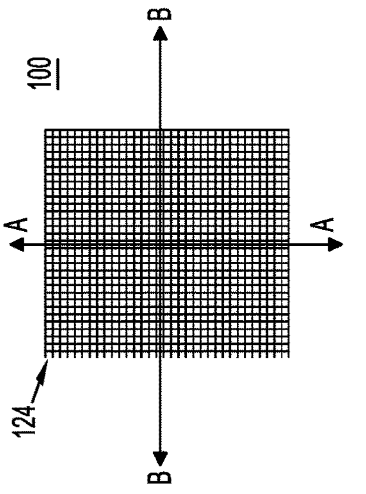
FIG. 1A depicts a top-down view illustrating a semiconductor structure according to an illustrative embodiment.
Figure 1C:
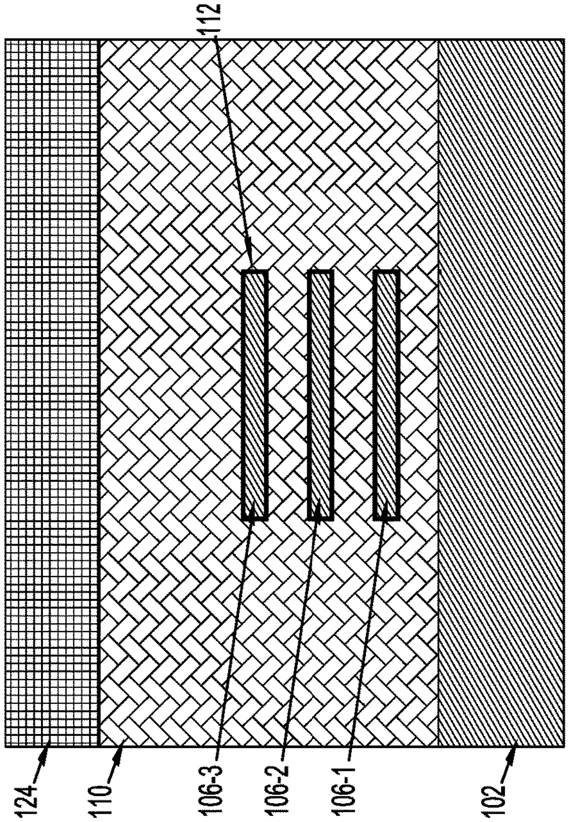
FIG. 1C depicts a cross-sectional view of a semiconductor structure taken along the B-B axis of FIG. 1A at the first-intermediate fabrication stage, according to an illustrative embodiment.
Figure 1B:
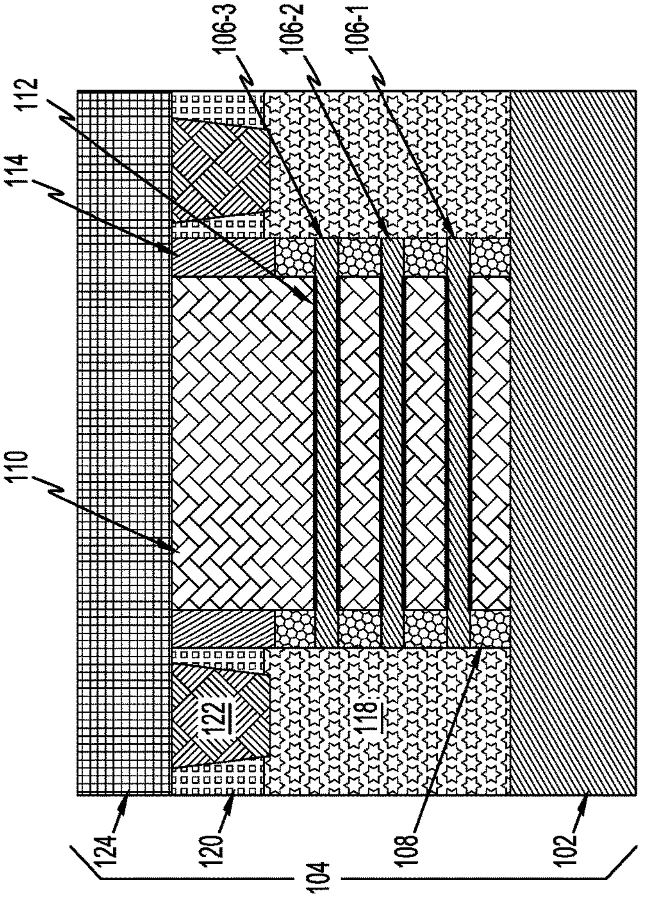
FIG. 1B depicts a cross-sectional view of a semiconductor structure taken along the A-A axis of FIG. 1A at a first-intermediate fabrication stage, according to an illustrative embodiment.

This disclosure relates generally to semiconductor devices, and more particularly to a stacked two-transistor (2T) dynamic random access memory (DRAM) cell and methods for its fabrication. However, it is to be understood that embodiments of the invention are not limited to the illustrative methods, apparatus, systems and devices but instead are more broadly applicable to other suitable methods, apparatus, systems and devices.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. Also, in the figures, the illustrated scale of one layer, structure, and/or region relative to another layer, structure, and/or region is not necessarily intended to represent actual scale.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 10% or less than the stated amount or 1% or less.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

As noted above, the dynamic RAM or DRAM, stores the binary information in the form of electric charges that are stored in capacitors. In the current DRAM industry, the scaling of DRAM cells is very hard due to strict transistor leakage requirement for data retention. For example, a current 2T DRAM cell is formed as a planar 2T DRAM cell for ease of manufacturing, but suffers from poor area efficiency and low capacitance. The illustrative embodiments described herein overcome the foregoing drawbacks by fabricating a stacked two-transistor (2T) dynamic random access memory (DRAM) cell which utilizes a nanosheet field-effect transistor (FET) as the read transistor with a relatively high capacitance per footprint and a FINFET transistor based on fins derived from an oxide semiconductor material as the write transistor with relatively low leakage current. By stacking the two transistors vertically a higher area efficiency is achieved. In addition, the bottom and top transistors are in an orthogonal (i.e., perpendicular) configuration to each other for a higher area efficiency.

Accordingly, referring now to the drawings in which like numerals represent the same of similar elements, FIGS. 1A-7B illustrate various processes for fabricating stacked two-transistor (2T) DRAM cells. Note that the same reference numeral (100) is used to denote the semiconductor structure through the various intermediate fabrication stages illustrated in FIGS. 1A-7B. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-7B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Referring now to FIGS. 1A-7B, FIG. 1A shows a top-down view of a semiconductor structure 100, following formation of a field-effect transistor having a nanosheet stack structure. FIG. 1B shows a first side cross-sectional view of semiconductor structure 100, taken along the A-A axis in the top-down view of FIG. 1A. FIG. 1C shows a second side cross-sectional view of semiconductor structure 100, taken along the B-B axis in the top-down view of FIG. 1A.

Semiconductor structure 100 includes a substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

A first field-effect transistor 104 having nanosheet channel layers 106-1, 106-2 and 106-3 (collectively, nanosheet channel layers 106) is formed over the substrate 102 utilizing conventional semiconductor processing with, for example, sacrificial layers (not shown). The first field-effect transistor 104 is also referred to as a nanosheet field-effect transistor containing nanosheet channel layers 106. The nanosheet channel layers 106 may be formed of Si or another suitable material (e.g., a material similar to that used for the substrate 102). Although three nanosheet channel layers 106 are shown, the number of nanosheet channel layers should not be considered limiting. In an illustrative embodiment, the nanosheet channel layers 106 can have a length ranging from about 10 to about 100 nanometers (nm) and a width ranging from about 3 to about 10.

Following semiconductor processing, the semiconductor structure 100 further includes inner spacers 108, and gate structure 110 including work function metal 112 for each respective FET device, sidewall spacers 114, and source/drain regions 118.

The inner spacers 108 may be formed to fill indent spaces (e.g., resulting from indent etches of the sacrificial layers prior to their removal). The inner spacers 108 may be formed of silicon nitride (SiN) or another suitable material such as SiBCN, silicon carbide oxide (SiCO), SiOCN, etc.

The gate structure 110 may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The gate conductor layer may include a metal gate or work function metal (WFM) 112. The WFM 112 for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The sidewall spacers 114 may be formed by any conventional technique and of any suitable insulator, such as SiN, silicon boron carbide nitride (SiBCN), silicon oxycarbonitride (SiOCN), etc.

The source/drain regions 118 may be formed using epitaxial growth processes. The source/drain regions 118 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si: C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

An interlayer dielectric (ILD) layer 120 is formed on source/drain regions 118 using convention deposition techniques such as ALD, followed by planarization using chemical mechanical planarization (CMP) or any other suitable planarization process. The ILD layer 120 may be formed of any suitable isolating material, such as $SiO_2$, SiOC, SiON, etc.

Source/drain contacts 122 are formed in ILD layer 120 by any conventional technique. For example, in an illustrative embodiment, source/drain contacts 122 can be formed by patterning ILD layer 120 and utilizing conventional lithographic and etching processes to form a via. Next, contact metallization is performed by, for example, forming a silicide liner, such as Ti, Ni, or NiPt, followed by an adhesion metal liner, such as TiN, TaN, followed by a conductive metal, such as tungsten (W), aluminum (Al), copper (Cu), cobalt (Co), ruthenium (Ru), molybdenum (Mo), or any other suitable conductive material. In various embodiments, the high conductance metal can be deposited in the via by physical vapor deposition (PVD), atomic layer deposition (ALD), chemical vapor deposition (CVD) and/or plating. The contact metal can be planarized using, for example, a planarizing process such as CMP. Other planarization processes can include grinding and polishing.

ILD layer 124 is formed on a top surface of semiconductor structure 100 and can be of any material used for ILD layer 120. The conductive metal can be planarized using, for example, a planarizing process such as CMP or any other suitable planarization process. Other planarization processes can include grinding and polishing.

Figure 2B:
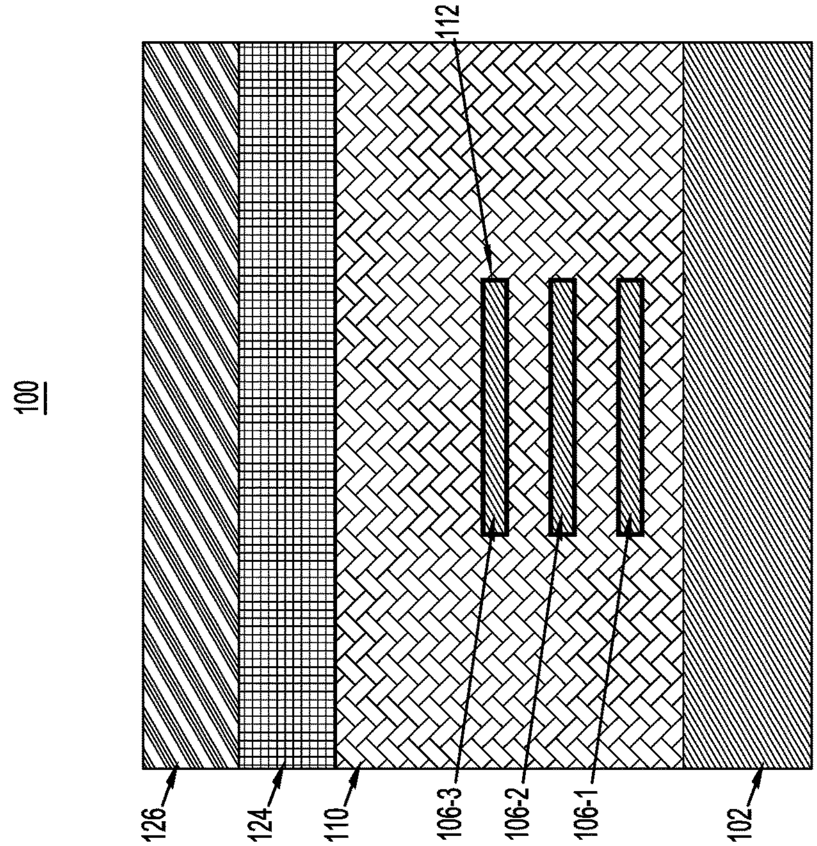
FIG. 2B depicts a cross-sectional view of a semiconductor structure taken along the B-B axis of FIG. 1A at the second-intermediate fabrication stage, according to an illustrative embodiment.
Figure 2A:
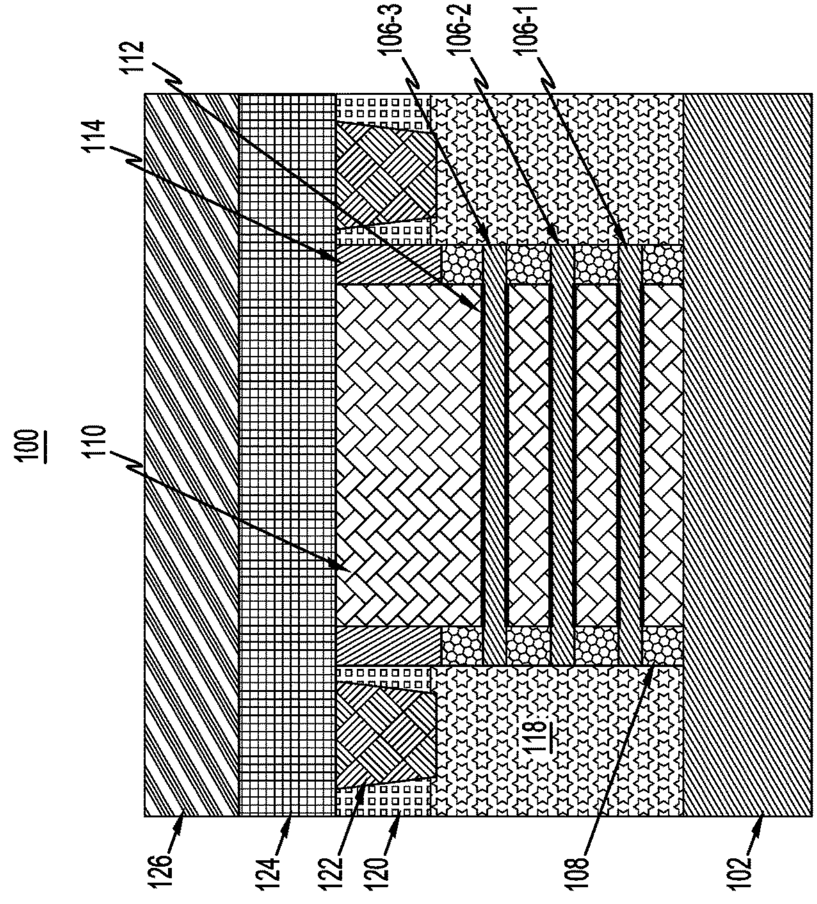
FIG. 2A depicts a cross-sectional view of a semiconductor structure taken along the A-A axis of FIG. 1A at a second-intermediate fabrication stage, according to an illustrative embodiment.

FIGS. 2A and 2B are a cross-sectional view of the semiconductor structure 100 at a second-intermediate fabrication stage. During this stage, an oxide semiconductor channel layer 126 is deposited on ILD layer 124. In various embodiments, the oxide semiconductor channel layer 126 can be deposited by, for example, CVD, PVD, ALD, and/or plating. The oxide semiconductor channel layer 126 can be planarized using, for example, a planarizing process such as CMP. Other planarization processes can include grinding and polishing.

In an illustrative embodiment, an oxide semiconductor material for oxide semiconductor channel layer 126 includes an amorphous metal oxide. In an illustrative embodiment, suitable oxide semiconductor material for oxide semiconductor channel layer 126 includes, for example, indium oxide, zinc oxide, tin oxide, indium tin oxide (ITO), fluorine-doped tin oxide (FTO), gallium-doped zinc oxide (GZO), aluminum-doped zinc oxide (AZO), indium-zinc oxide (IZO), indium tin oxide (ITO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO) and the like. In one embodiment, the oxide semiconductor material for oxide semiconductor channel layer 126 includes, for example, at least one of an IZO (InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based, or FIZO(FeInZnO)-based oxide semiconductor material.

Figure 3B:
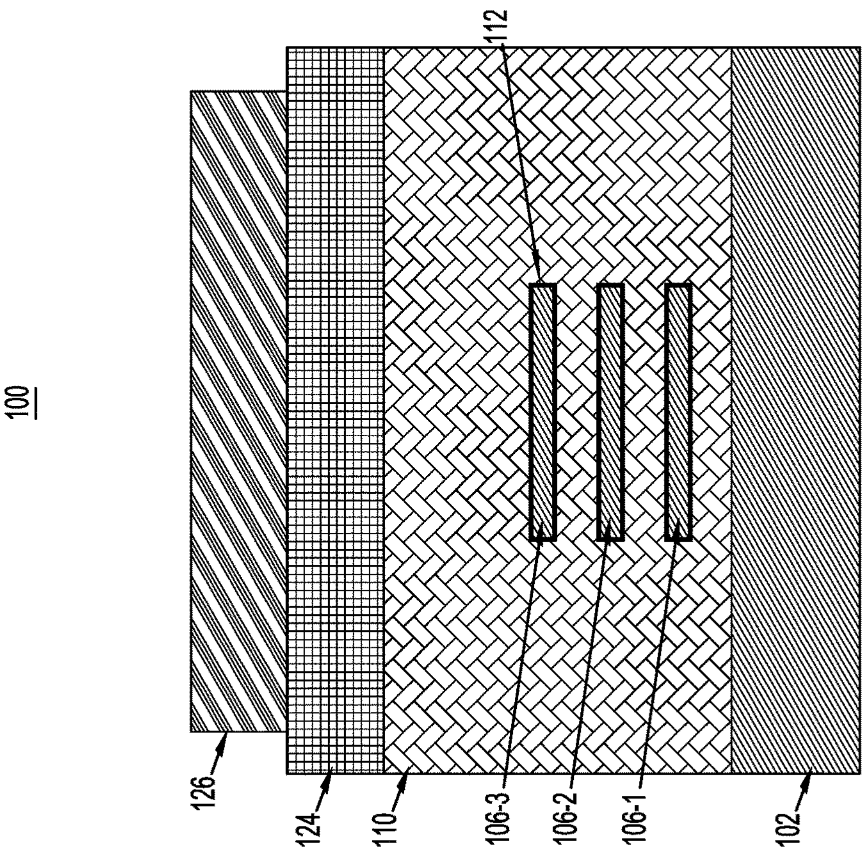
FIG. 3B depicts a cross-sectional view of a semiconductor structure taken along the B-B axis of FIG. 1A at the third-intermediate fabrication stage, according to an illustrative embodiment.
Figure 3A:
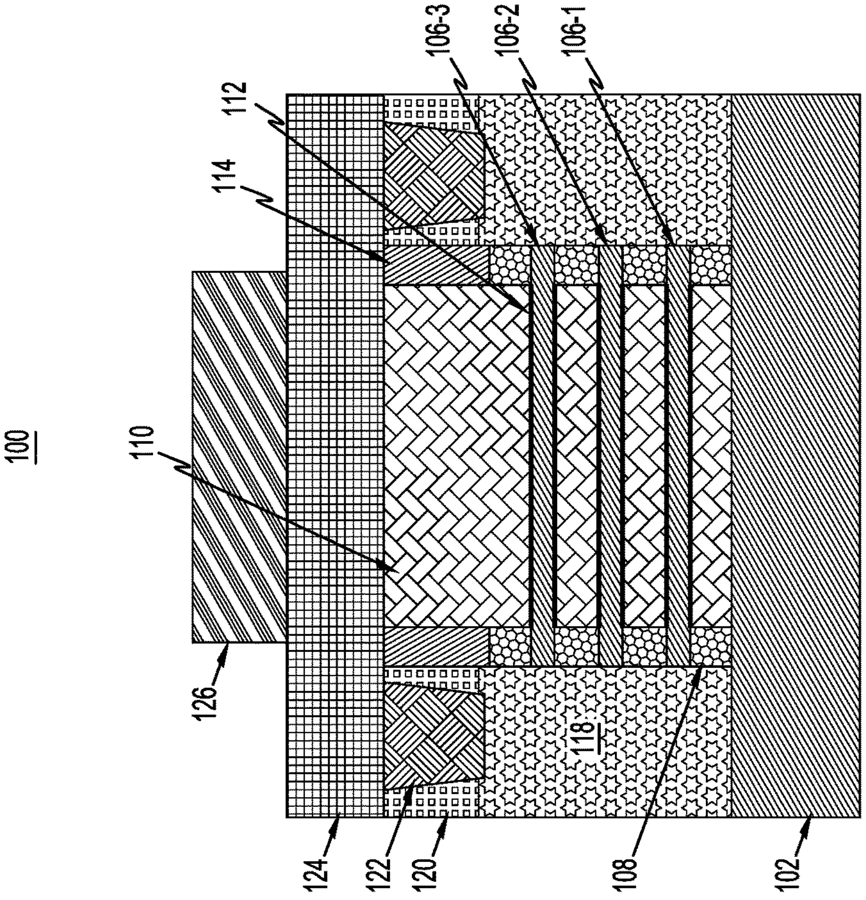
FIG. 3A depicts a cross-sectional view of a semiconductor structure taken along the A-A axis of FIG. 1A at a third-intermediate fabrication stage, according to an illustrative embodiment.

FIGS. 3A and 3B are a cross-sectional view of the semiconductor structure 100 at a third-intermediate fabrication stage. During this stage, the oxide semiconductor channel layer 126 are patterned for subsequent fin formation as discussed below. Oxide semiconductor channel layer 126 can be patterned by depositing a material of a hard mask layer over the structure, followed by lithographic processing to result in a patterned hard mask layer. The material of the hard mask layer may include SiN, a multi-layer of SiN and $SiO_2$, or another suitable material. Once the hard mask layer is patterned, a cut is performed in the oxide semiconductor channel layer 126 to expose ILD layer 124. As shown in FIG. 3A, the remaining oxide semiconductor channel layer 126 is disposed over the gate structure 110 and sidewall spacers 114. The hard mask layer can then be removed by any suitable etching technique.

Figure 4B:
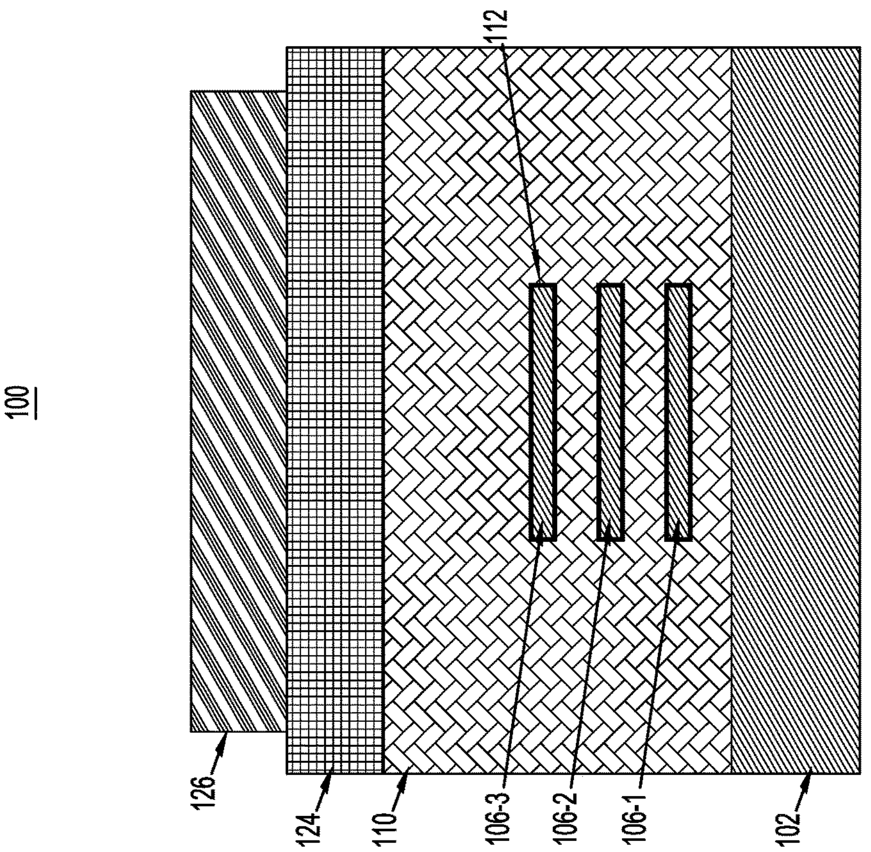
FIG. 4B depicts a cross-sectional view of a semiconductor structure taken along the B-B axis of FIG. 1A at the fourth-intermediate fabrication stage, according to an illustrative embodiment.
Figure 4A:
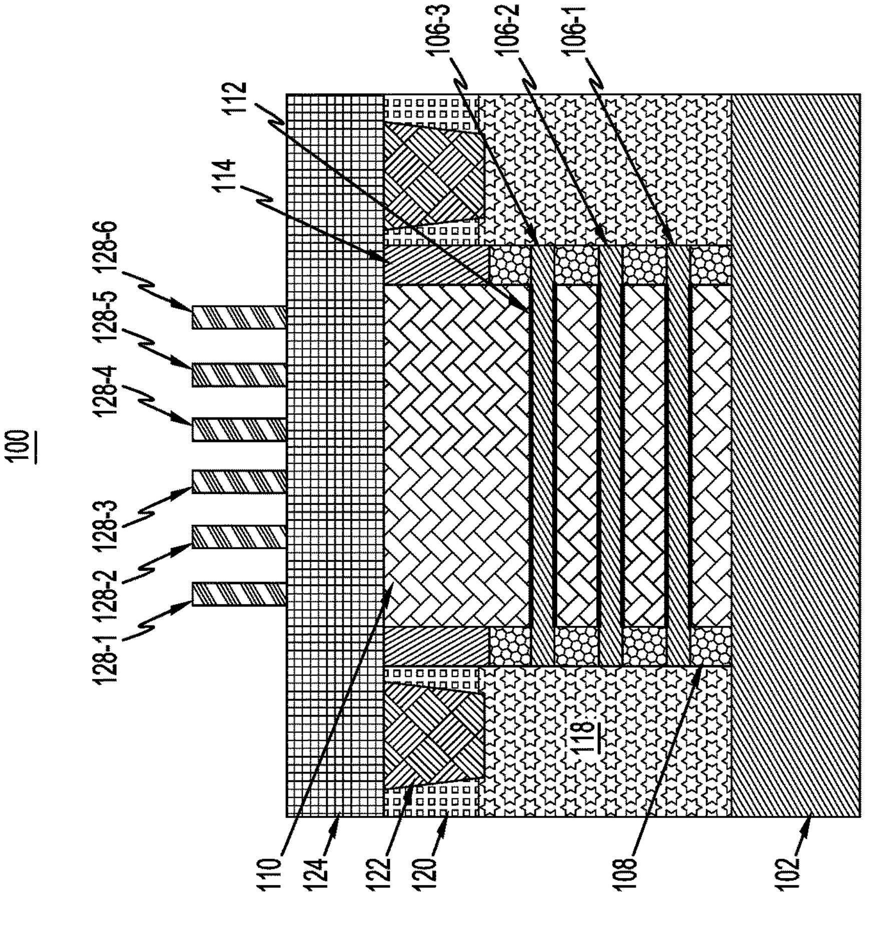
FIG. 4A depicts a cross-sectional view of a semiconductor structure taken along the A-A axis of FIG. 1A at a fourth-intermediate fabrication stage, according to an illustrative embodiment.

FIGS. 4A and 4B are a cross-sectional view of the semiconductor structure 100 at a fourth-intermediate fabrication stage. During this stage, a set of vertical fins 128-1 through 128-6 are formed. Although six vertical fins for the sets of vertical fins 128-1 through 128-6 are shown, the number of fins should not be considered limiting. The set of vertical fins 128-1 through 128-6 may be formed by first depositing a hard mask layer (not shown) on oxide semiconductor channel layer 126. Next, vertical fins 128-1 through 128-6 are formed using, for example, an anisotropic etch such as reactive ion etching (RIE) that selectively removes material from the oxide semiconductor channel layer 126 in regions that are not protected by the hard mask layer. As used herein, the term "selective" in reference to a material removal process denotes that the rate of material removal for a first material is greater than the rate of removal for at least another material of the structure to which the material removal process is being applied.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point in the present embodiment include ion beam etching, plasma etching or laser ablation.

Figure 5B:
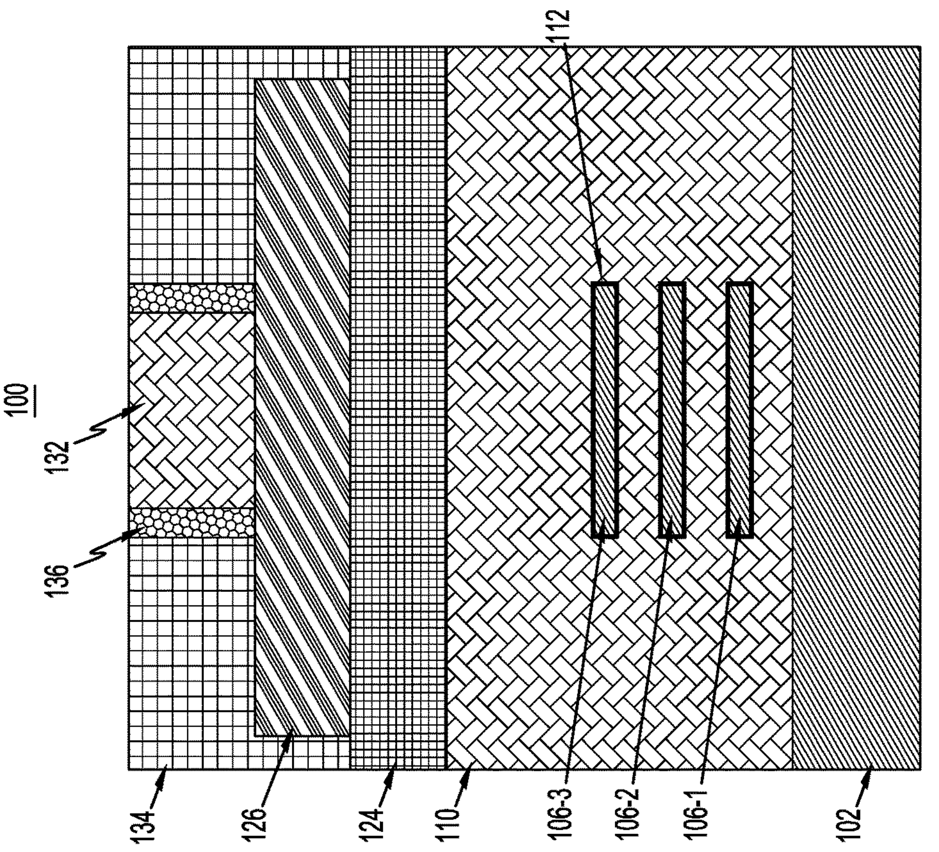
FIG. 5B depicts a cross-sectional view of a semiconductor structure taken along the B-B axis of FIG. 1A at the fifth-intermediate fabrication stage, according to an illustrative embodiment.
Figure 5A:
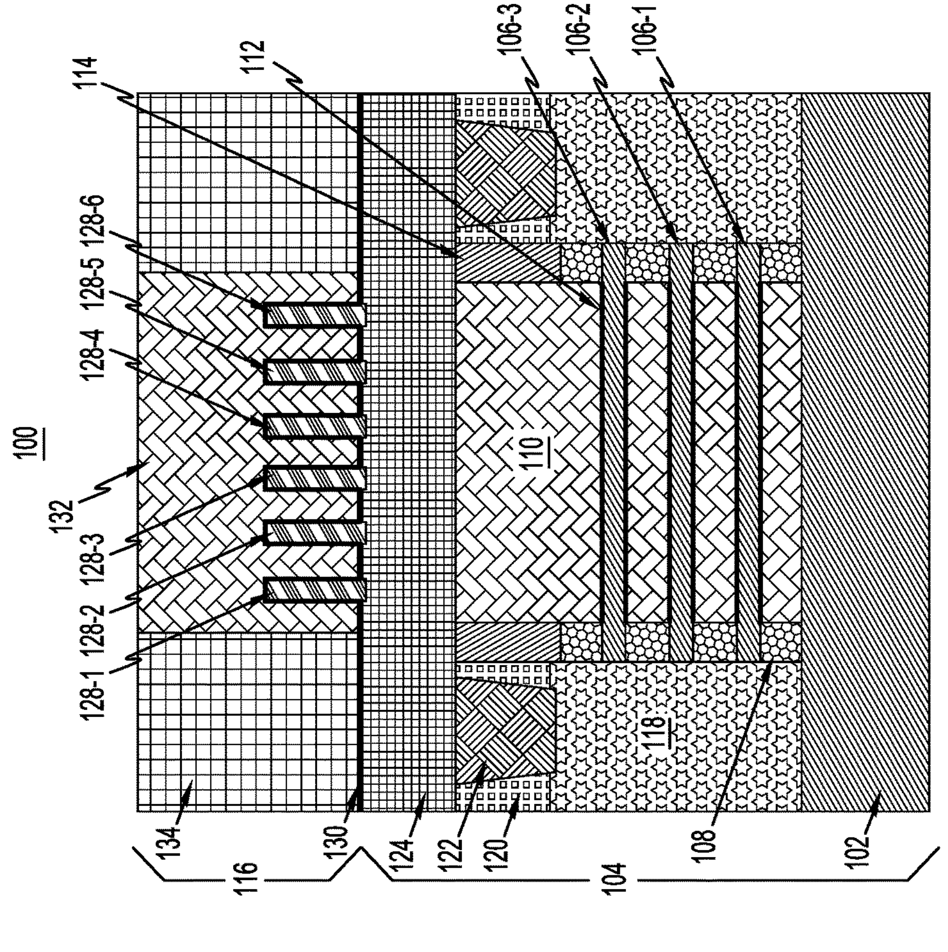
FIG. 5A depicts a cross-sectional view of a semiconductor structure taken along the A-A axis of FIG. 1A at a fifth-intermediate fabrication stage, according to an illustrative embodiment.

FIGS. 5A and 5B are a cross-sectional view of the semiconductor structure 100 at a fifth-intermediate fabrication stage. During this stage, gate structure 132, ILD layer 134 and sidewall spacers 136 are formed. Gate structure 132 is formed around the set of vertical fins 128-1 through 128-6 including work function metal (WFM) 130 to form a second field-effect transistor 116 over the first field-effect transistor 104 in a stacked configuration. The second field-effect transistor 116 is also referred to as a fin field-effect transistor (FINFET). Gate structure 132 may comprise a gate dielectric layer and a gate conductor layer. The gate dielectric layer may be formed of a high-k dielectric material. Examples of high-k dielectric materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k dielectric materials may further include dopants such as lanthanum (La), aluminum (Al), and magnesium (Mg).

The WFM 130 for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The sidewall spacers 136 may be formed by any conventional technique and of materials similar to that of sidewall spacers 114.

The semiconductor structure further includes ILD layer 134. ILD layer 134 can be formed by a similar process and of similar material as ILD layer 120.

Figure 6B:
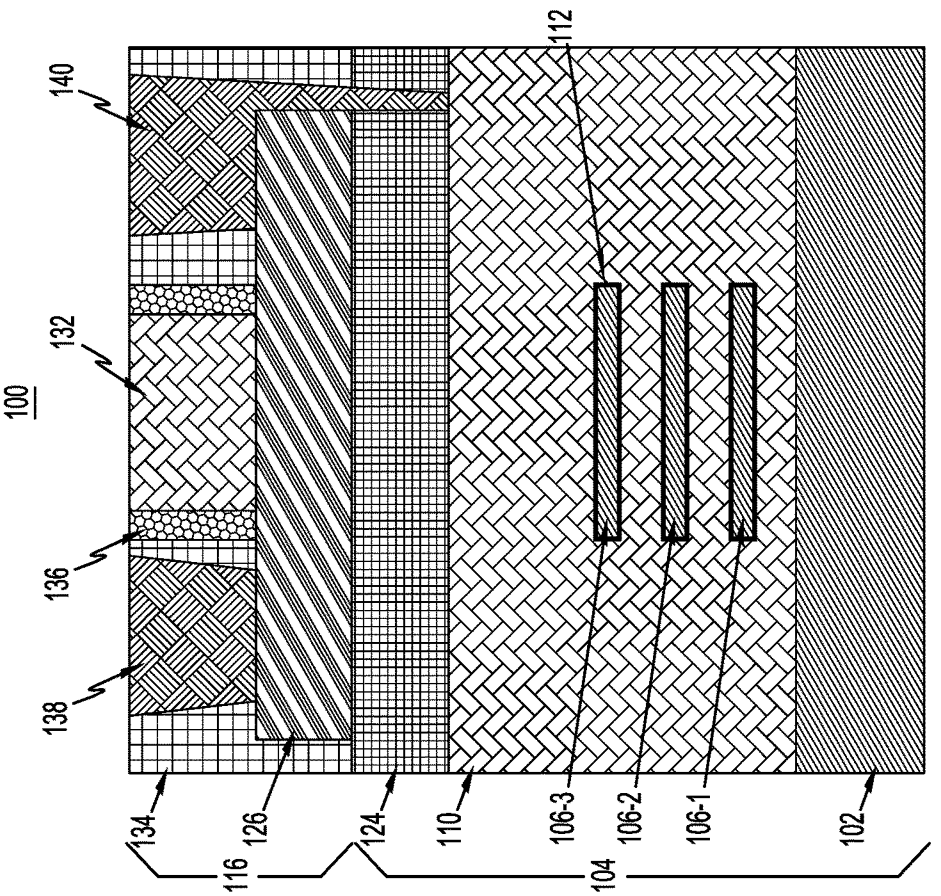
FIG. 6B depicts a cross-sectional view of a semiconductor structure taken along the B-B axis of FIG. 1A at the sixth-intermediate fabrication stage, according to an illustrative embodiment.
Figure 6A:
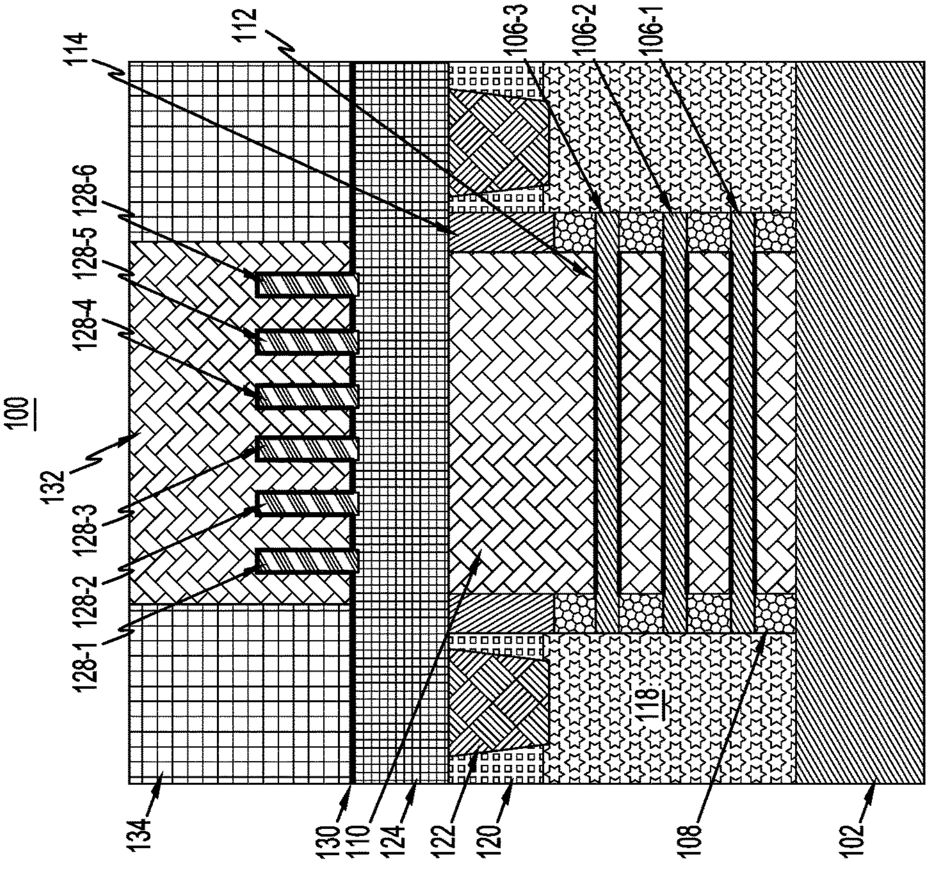
FIG. 6A depicts a cross-sectional view of a semiconductor structure taken along the A-A axis of FIG. 1A at a sixth-intermediate fabrication stage, according to an illustrative embodiment.

FIGS. 6A and 6B are a cross-sectional view of the semiconductor structure 100 at a sixth-intermediate fabrication stage. During this stage, metal contact 138 and gate contact 140 are formed by any conventional technique (see FIG. 6B). For example, in an illustrative embodiment, metal contact 138 can be formed by patterning ILD layer 134 and utilizing conventional lithographic and etching processes to form a via. Next, contact metallization is performed by, for example, forming a silicide liner, such as Ti, Ni, or NiPt, followed by an adhesion metal liner, such as TiN. TaN, followed by a conductive metal, such as tungsten (W), aluminum (Al), copper (Cu), cobalt (Co), ruthenium (Ru), molybdenum (Mo), or any other suitable conductive material. In various embodiments, the high conductance metal can be deposited in the via by CVD, PVD, ALD, and/or plating. The contact metal can be planarized using, for example, a planarizing process such as CMP. Other planarization processes can include grinding and polishing.

In another illustrative embodiment, gate contact 140 can be formed by patterning ILD layer 134 and utilizing conventional lithographic and etching processes to form a via through ILD layer 134, a portion of oxide semiconductor channel layer 126, ILD layer 124 and into a portion of gate structure 110. Next, contact metallization is performed by, for example, forming a silicide liner, such as Ti, Ni, or NiPt, followed by an adhesion metal liner, such as TIN, TaN, followed by a conductive metal, such as tungsten (W), aluminum (Al), copper (Cu), cobalt (Co), ruthenium (Ru), molybdenum (Mo), or any other suitable conductive material. In various embodiments, the high conductance metal can be deposited in the via by CVD, PVD, ALD, and/or plating. The contact metal can be planarized using, for example, a planarizing process such as CMP. Other planarization processes can include grinding and polishing.

Figure 7B:
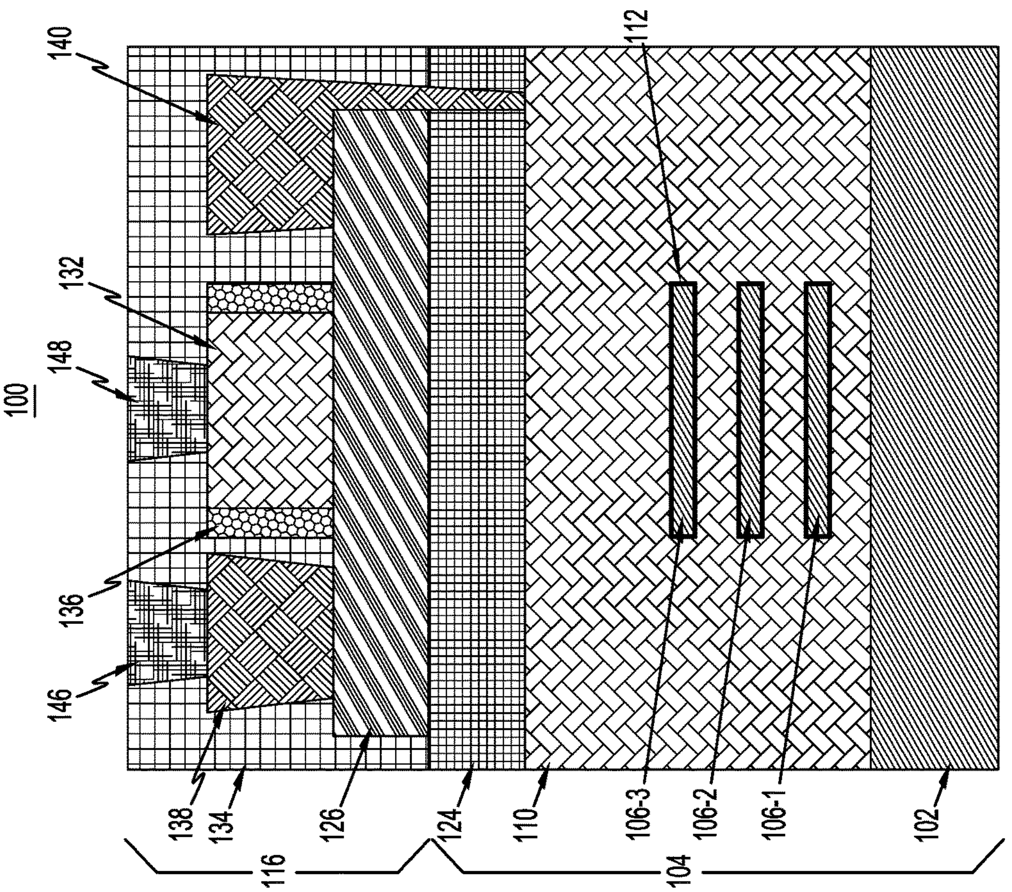
FIG. 7B depicts a cross-sectional view of a semiconductor structure taken along the B-B axis of FIG. 1A at the seventh-intermediate fabrication stage, according to an illustrative embodiment.
Figure 7A:
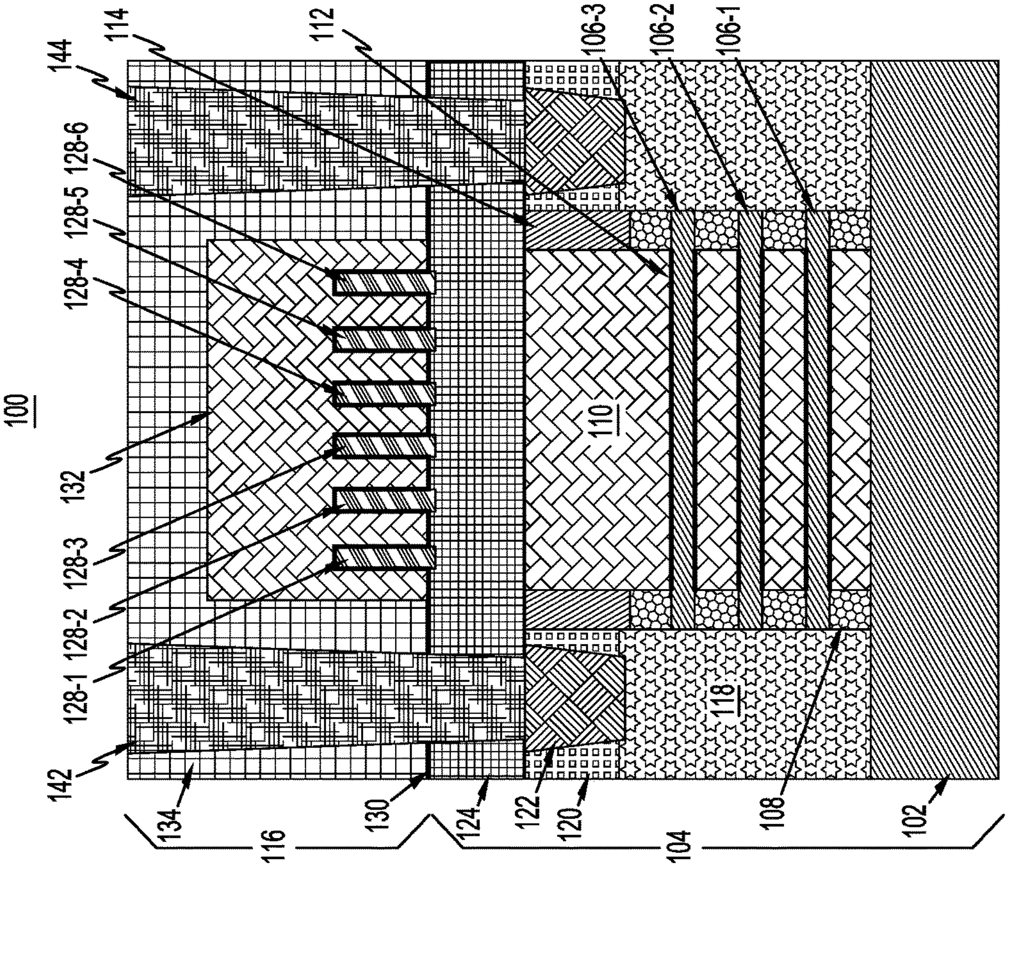
FIG. 7A depicts a cross-sectional view of a semiconductor structure taken along the A-A axis of FIG. 1A at a seventh-intermediate fabrication stage, according to an illustrative embodiment.

FIGS. 7A and 7B are a cross-sectional view of the semiconductor structure 100 at a seventh-intermediate fabrication stage. During this stage, BEOL interconnects, also referred to as read word line (RWL) 142, read bit line (RBL) 144, write bit line (WBL) 146 and write word line (WWL) 148, are formed on semiconductor structure 100 using conventional techniques to provide the stacked two-transistor (2T) DRAM cell. For example, in an illustrative embodiment, the BEOL interconnects can be formed by first depositing an additional amount of ILD layer 134, patterning ILD layer 134 and utilizing conventional lithographic and etching processes to form the respective vias for the BEOL interconnects. Next, contact metallization is performed by, for example, forming a silicide liner, such as Ti, Ni, or NiPt, followed by an adhesion metal liner, such as TiN, TaN, followed by a conductive metal, such as tungsten (W), aluminum (Al), copper (Cu), cobalt (Co), ruthenium (Ru), molybdenum (Mo), or any other suitable conductive material. In various embodiments, the high conductance metal can be deposited in the via by CVD, PVD, ALD, and/or plating. The contact metal can be planarized using, for example, a planarizing process such as CMP. Other planarization processes can include grinding and polishing.

The resulting stacked two-transistor (2T) DRAM cell includes the first field-effect transistor 104 having a read word line (RWL) 142 and a read bit line (RBL) 144, and the second field-effect transistor 116 having a write bit line (WBL) 146 and a write word line (WWL) 148. In an illustrative embodiment, write bit line 146 is connected to a source/drain region of the second field-effect transistor 116 (not shown) and write word line 148 is connected to gate structure 132.

In a non-limiting embodiment, the first field-effect transistor 104 is a nanosheet FET which is used as a read transistor, and the second field-effect transistor 116 is a FINFET which is used as a write transistor. In an illustrative embodiment, the first field-effect transistor 104 is in an orthogonal configuration to the second field-effect transistor 116.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETS, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a nanosheet field-effect transistor comprising a nanosheet stack structure; and a fin field-effect transistor comprising a set of vertical fins, wherein each of the vertical fins comprises an oxide semiconductor material;

wherein the fin field-effect transistor further comprises a read write line connected to a first metal contact of the nanosheet field-effect transistor and a read bit line connected to a second metal contact of the nanosheet field-effect transistor; and wherein the nanosheet field-effect transistor and the fin field-effect transistor are in a stacked configuration.

2. The semiconductor structure according to claim 1, wherein the nanosheet field-effect transistor is in an orthogonal configuration relative to the fin field-effect transistor.

3. The semiconductor structure according to claim 1, wherein the nanosheet field-effect transistor further comprises a first source/drain region disposed on a first side of the nanosheet stack structure and a second source/drain region disposed on a second side of the nanosheet stack structure.

4. The semiconductor structure according to claim 3, wherein the first metal contact is disposed on the first source/drain region and the second metal contact is disposed on the second source/drain region.

5. The semiconductor structure according to claim 3, wherein the nanosheet field-effect transistor further comprises a first gate structure disposed on the nanosheet stack structure and the fin field-effect transistor further comprises a second gate structure disposed on the set of vertical fins.

6. The semiconductor structure according to claim 1, wherein the oxide semiconductor material comprises at least one of an (InZnO)-based, (InGaO)-based, (InSnO)-based, (InGaZnO)-based, (InGaZnSnO)-based, (GaZnSnO)-based, (GaZnO)-based, (InSnZnO)-based or (FelnZnO)-based oxide semiconductor material.

7. The semiconductor structure according to claim 1, which is a part of a dynamic random access memory cell.

8. An integrated circuit, comprising:
one or more semiconductor structures, wherein at least one of the semiconductor structures comprises:
a nanosheet field-effect transistor comprising a nanosheet stack structure; and
a fin field-effect transistor comprising a set of vertical fins, wherein each of the vertical fins comprises an oxide semiconductor material;
wherein the nanosheet field-effect transistor further comprises a read write line connected to a first metal contact of the nanosheet field-effect transistor and a read bit line connected to a second metal contact of the nanosheet field-effect transistor; and
wherein the nanosheet field-effect transistor and the fin field-effect transistor are in a stacked configuration.

9. The integrated circuit according to claim 8, wherein the nanosheet field-effect transistor is in an orthogonal configuration relative to the fin field-effect transistor.

10. The integrated circuit according to claim 8, wherein the nanosheet field-effect transistor further comprises a first source/drain region disposed on a first side of the nanosheet stack structure and a second source/drain region disposed on a second side of the nanosheet stack structure.

11. The integrated circuit according to claim 10, wherein the first metal contact is disposed on the first source/drain region and the second metal contact is disposed on the second source/drain region.

12. The integrated circuit according to claim 10, wherein the nanosheet field-effect transistor further comprises a first gate structure disposed on the nanosheet stack structure and the fin field-effect transistor further comprises a second gate structure disposed on the set of vertical fins.

13. The integrated circuit according to claim 8, wherein the oxide semiconductor material comprises at least one of an (InZnO)-based, (InGaO)-based, (InSnO)-based, (InGaZnO)-based, (InGaZnSnO)-based, (GaZnSnO)-based, (GaZnO)-based, (InSnZnO)-based or (FelnZnO)-based oxide semiconductor material.

14. The integrated circuit according to claim 8, wherein the integrated circuit is a part of a dynamic random access memory cell.

15. A semiconductor structure, comprising:
a nanosheet field-effect transistor comprising a nanosheet stack structure and a first gate structure; and
a fin field-effect transistor comprising:
a set of vertical fins, wherein each of the vertical fins comprises an oxide semiconductor material;
a second gate structure disposed on at least one vertical fin;
a write word line disposed on the second gate structure;
a write bit line disposed on the at least one vertical fin; and
a metal contact connected to the first gate structure;
wherein the nanosheet field-effect transistor and the fin field-effect transistor are in a stacked configuration.

16. The semiconductor structure according to claim 15, wherein the nanosheet field-effect transistor is in an orthogonal configuration relative to the fin field-effect transistor.

17. The semiconductor structure according to claim 15, wherein the fin field-effect transistor further comprises another metal contact contacted with the second gate structure.

18. The semiconductor structure according to claim 15, wherein the oxide semiconductor material comprises at least one of an (InZnO)-based, (InGaO)-based, (InSnO)-based, (InGaZnO)-based, (InGaZnSnO)-based, (GaZnSnO)-based, (GaZnO)-based, (InSnZnO)-based or (FelnZnO)-based oxide semiconductor material.

* * * * *